(12) United States Patent
Chen

(10) Patent No.: US 12,184,254 B2
(45) Date of Patent: Dec. 31, 2024

(54) GLITCH-FREE LOW-PASS FILTER CIRCUIT AND SYSTEM CIRCUIT USING THE SAME

(71) Applicant: NUVOTON TECHNOLOGY CORPORATION, Hsinchu (TW)

(72) Inventor: Chou-Chuan Chen, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 43 days.

(21) Appl. No.: 18/298,408

(22) Filed: Apr. 11, 2023

(65) Prior Publication Data

US 2024/0056055 A1 Feb. 15, 2024

(30) Foreign Application Priority Data

Aug. 12, 2022 (TW) .................................. 111130375

(51) Int. Cl.
*H03H 11/04* (2006.01)
*H03K 17/687* (2006.01)
*H03K 19/20* (2006.01)

(52) U.S. Cl.
CPC ......... *H03H 11/04* (2013.01); *H03K 17/6872* (2013.01); *H03K 19/20* (2013.01)

(58) Field of Classification Search
CPC .... H03H 11/04; H03H 11/38; H03K 17/6872; H03K 19/20; H03K 5/1252; H03K 5/125; H03K 17/16; H03K 17/161; H03K 3/02337; H03K 3/0377; H03K 3/13; H03K 3/2893; H03K 3/3565
See application file for complete search history.

(56) References Cited

U.S. PATENT DOCUMENTS 11,258,432 B1 * 2/2022 Onódy ................. H03K 5/1254

* cited by examiner

*Primary Examiner* — Jung Kim
(74) *Attorney, Agent, or Firm* — MUNCY, GEISSLER, OLDS & LOWE, P.C.

(57) ABSTRACT

A glitch-free low-pass filter circuit includes an integrating circuit, a Schmitt trigger, a first feedback logic circuit and a second feedback logic circuit. The integrating circuit is used to integrate an input signal to generate an integral signal. The Schmitt trigger is used to receive the integral signal to generate a hysteresis signal. The first feedback logic circuit is used to pull the integral signal to a reset voltage or up to the set voltage based on an inverted input signal and an inverted hysteresis signal, wherein the inverted input signal and the inverted hysteresis signal are generated by performing an inversion process. The second feedback logic circuit is used to pull the integral signal down to the reset voltage or up to the set voltage based on the inverted hysteresis signal and an output signal, wherein the output signal is generated by performing the inversion process twice.

17 Claims, 4 Drawing Sheets

GLITCH-FREE LOW-PASS FILTER CIRCUIT AND SYSTEM CIRCUIT USING THE SAME

CROSS-REFERENCE TO RELATED APPLICATION

This application claims the priority from the TW Patent Application No. 111130375, filed on Aug. 12, 2022, and all contents of such TW Patent Application are included in the present disclosure.

BACKGROUND

1. Field of the Invention

The present disclosure relates to a low-pass filter circuit, in particular to, a glitch-free low pass filter circuit and a system circuit using the same, wherein the low-pass filter adopts an arbitration mechanism to solve the problems caused by a control contention. For example, a low-pass filter circuit may output a short pulse, and/or when a pulse width of the input signal is close to a preset filter pulse width corresponding to the low-pass filter circuit, the output signal may be incorrectly transitioned.

2. Description of the Related Art

Power glitch attack is one of the most common attack methods. The power glitch attack is used to make a security-protected chip, after such an attack, release the security-protection mode of the chip, so as to steal important information in the chip. Usually, the power glitch can be filtered out via a low-pass filter, so that it prevents the chip from the above attack. In addition, in order to avoid generating a glitch owing to the noise of a clock signal, the low-pass filter circuit can also be used to filter the glitch in the clock signal. In this way, it prevents a back-end circuit from operation errors because of receiving a clock signal with the glitch.

One of low-pass filter circuits in the prior art is shown in FIG. 1. A low-pass filter circuit 1 includes an integrating circuit, and the integrating circuit comprises a resistor R1 and a capacitor C1 and a Schmitt trigger SCHTRG. Besides, one end of the resistor R1 is configured to receive an input signal VIN. The other end of the resistor R1 is electrically connected to an input end of the Schmitt trigger SCHTRG and one end of the capacitor C1. The other end of the capacitor C1 is electrically connected to a low voltage, such as a ground voltage GND. When the input signal VIN has a glitch or other interference, the low-pass filter circuit 1 eliminates the glitch or other interference of the input signal VIN and the elimination achieves a certain level by utilizing the low-pass filter characteristics of the integrating circuit and the hysteresis characteristics of the Schmitt trigger SCHTRG to generate an output signal VOUT.

However, the low-pass filter circuit 1 lacks a charge removal mechanism of an integrating capacitor (i.e., the capacitor C1). Thus, the low-pass filter result still has considerable dependence on the waveform or pattern of the input signal VIN. When a designed charge/discharge time constant which is related to a resistance value of the resistor R1 and a capacitance value of the capacitor C1 does not match the pattern of the input signal VIN, it is possible that the glitch or other interference in the input signal VIN cannot be filtered out, and it results in the output signal VOUT being transitioned incorrectly.

In order to solve the above problems, a logic control circuit can be added under the structure of the preceding low-pass circuit to periodically remove the charge of the integrating capacitor. The low-pass filter circuit can filter out a signal which a pulse width thereof is smaller than a preset filter pulse width. However, due to the lack of a proper arbitration mechanism, when the pulse width of the signal is very close to the preset filter pulse width, the capacitor does not discharge properly. Therefore, an edge of the output signal forms a short pulse that is smaller than the pulse width instead.

As shown in FIG. 2, with time changes, the pulse width of the input signal VIN gradually decreases from originally greater than but close to the preset filter pulse width PW to be closer to the preset filter pulse width PW. Then, the edge of the output signal VOUT has the short pulse SP because the capacitor is not correctly discharged or charged. When the pulse width of the input signal VIN is closer to the preset filter pulse width PW, the short pulse SP is also generated at the edge of the output signal VOUT more obviously. Moreover, the short pulse SP may make a back-end load circuit of the low-pass filter circuit operate incorrectly.

SUMMARY

Based on one purpose of the present disclosure, an embodiment of the present disclosure provides a glitch-free low-pass filter circuit. The glitch-free low-pass filter circuit comprises an integrating circuit, a Schmitt trigger, a first feedback logic circuit and a second feedback logic circuit. The integrating circuit is configured to receive an input signal of the low-pass filter circuit, and integrate the input signal to generate an integral signal. The Schmitt trigger is electrically connected to the integrating circuit. The Schmitt trigger is configured to receive the integral signal, and generate a hysteresis signal based on the integral signal. The first feedback logic circuit is electrically connected to the integrating circuit and the Schmitt trigger. The first feedback logic circuit is configured to pull the integral signal down to a reset voltage or up to a set voltage based on an inverted input signal and an inverted hysteresis signal. Besides, the input inverted signal is generated by performing an inversion process on the input signal, and the inverted hysteresis signal is generated by performing the inversion process on the hysteresis signal. The second feedback logic circuit is electrically connected to the Schmitt trigger and the integrating circuit. The second feedback logic circuit is configured to pull the integral signal down to the reset voltage or up to the set voltage based on the inverted hysteresis signal and an output signal of the low-pass filter circuit. Moreover, the output signal is generated by performing the inversion process on the hysteresis signal twice.

Based on one purpose of the present disclosure, an embodiment of the present disclosure provides a glitch-free low-pass filter circuit. The low-pass filter circuit comprises an integrating circuit, a Schmitt trigger, a first feedback logic circuit and a second feedback logic circuit. The integrating circuit is configured to receive an input signal of the low-pass circuit, and integrate the input signal to generate an integral signal. The Schmitt trigger is electrically connected to the integrating circuit. The Schmitt trigger is configured to receive the integral signal, and generate a hysteresis signal based on the integral signal. The first feedback logic circuit is electrically connected to the integrating circuit and the Schmitt trigger. The first feedback logic circuit is configured to pull the integral signal down to a reset voltage or up to a set voltage based on the input signal and the hysteresis signal. The second feedback logic circuit is electrically connected to the Schmitt trigger and the integrating circuit.

The second feedback logic circuit is configured to pull the integral signal down to the reset voltage or up to the set voltage based on a transition state of the hysteresis signal. Regardless of the state of the input signal, when the hysteresis signal is transitioned, the second feedback logic signal pulls the integral signal down to the reset voltage or up to the set voltage.

Based on one purpose of the present disclosure, an embodiment of the present disclosure provides a system circuit. The system circuit comprises one of the aforementioned glitch-free low-pass filter circuit and a load circuit. The load circuit is electrically connected to the low-pass filter circuit. The load circuit is configured to receive the output signal as a clock signal for operating.

To sum up, in the arbitration mechanism utilizing the glitch-free low-pass filter circuit provided by the embodiments of the present disclosure, the transition state of the hysteresis signal output by the Schmitt trigger has highest authority. As a result, the technical issue of the output signal transition which caused by the short pulse and the pulse width of the input signal smaller than the expected one can be completely solved.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

DESCRIPTION OF THE PREFERRED EMBODIMENTS

Figure 1:
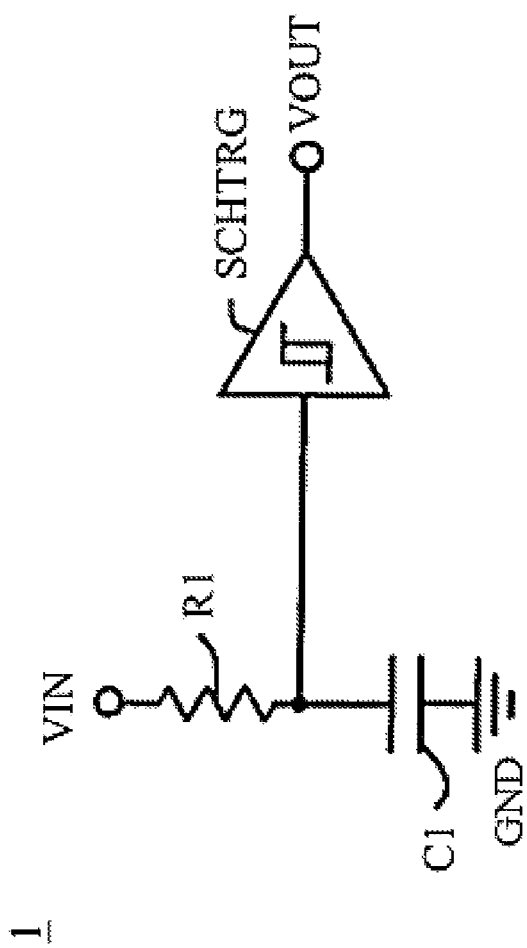
FIG. 1 is a circuit diagram of a low-pass filter circuit in the related art.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

Figure 2:
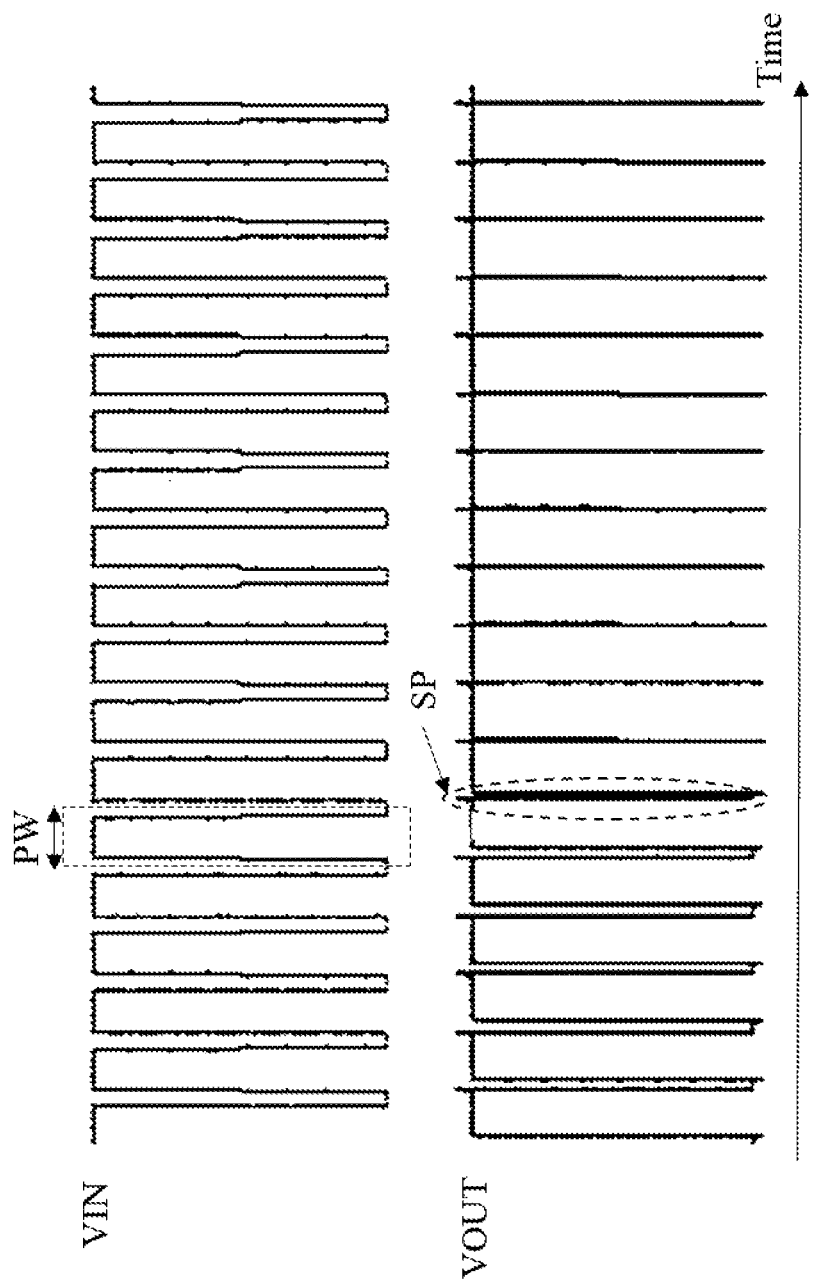
FIG. 2 is a waveform diagram, of a signal in a low-pass filter circuit with a charge removal mechanism of an integrating capacitor in the related art.

When the pulse width of the input signal of FIG. 2 is close to the preset filter pulse width corresponding to the low-pass filter circuit, the output signal generated has the short pulse SP, and causes the error operation of the subsequent load circuit. Alternatively, since the capacitor of the integrating circuit is not completely charged or discharged, the pulse width of the input signal smaller than the expected pulse width also causes the transition of the output signal. In order to solve the above technical problems, embodiments of the present disclosure provide a glitch-free low-pass circuit and a system circuit using the same. Besides, the low-pass filter circuit of the present disclosure utilizes an arbitration mechanism to solve the problems caused by a control contention. Further, the low-pass filter circuit of the present disclosure is designed so that when a hysteresis signal of the Schmitt trigger is transitioned, regardless of the state of an input signal, the feedback logic circuit pulls an integral signal down to a reset voltage or up to a set voltage. In this way, the capacitor is fully charged or discharged. Simply speaking, in the arbitration mechanism, a transition state of the hysteresis signal output by the Schmitt trigger has the highest authority to completely solve the technical problem of the output signal transition caused by the short pulse and the pulse width of the input signal smaller than expected pulse width.

In other words, when the pulse width of the input signal is close to the preset filter pulse width corresponding to the low-pass filter circuit, the output signal generated by the glitch-free low-pass filter circuit according to the embodiments of the present disclosure does not have the short pulse. Therefore, it can be ensured that the subsequent load circuit utilizing the output signal generated by the low-pass filter circuit operates correctly. Further, the low-pass filter circuit does not have the technical problems of the output signal transition because of the pulse width of the input signal smaller than the expected pulse width which is caused by the capacitor being not fully charged or discharged.

Furthermore, the above-mentioned system circuit includes the aforementioned low-pass filter circuit and a load circuit. The load circuit is electrically connected to the low-pass filter circuit. The load circuit is configured to obtain the output signal of the low-pass filter circuit for operation. For example, the input signal is a clock signal, and the output signal is processed via the low-pass filter circuit to be a glitch-free clock signal. Thus, the load circuit can directly use the output signal as the clean clock signal for operation. The load circuit may be various types of load circuits, such as a microcontroller, a memory controller or a front-end communication circuit, etc., and the present disclosure is not limited thereto. Additionally, the input signal is not limited to the clock signal, and may be other types of signals, and the present disclosure is not limited to the type of the input signal.

Figure 3:
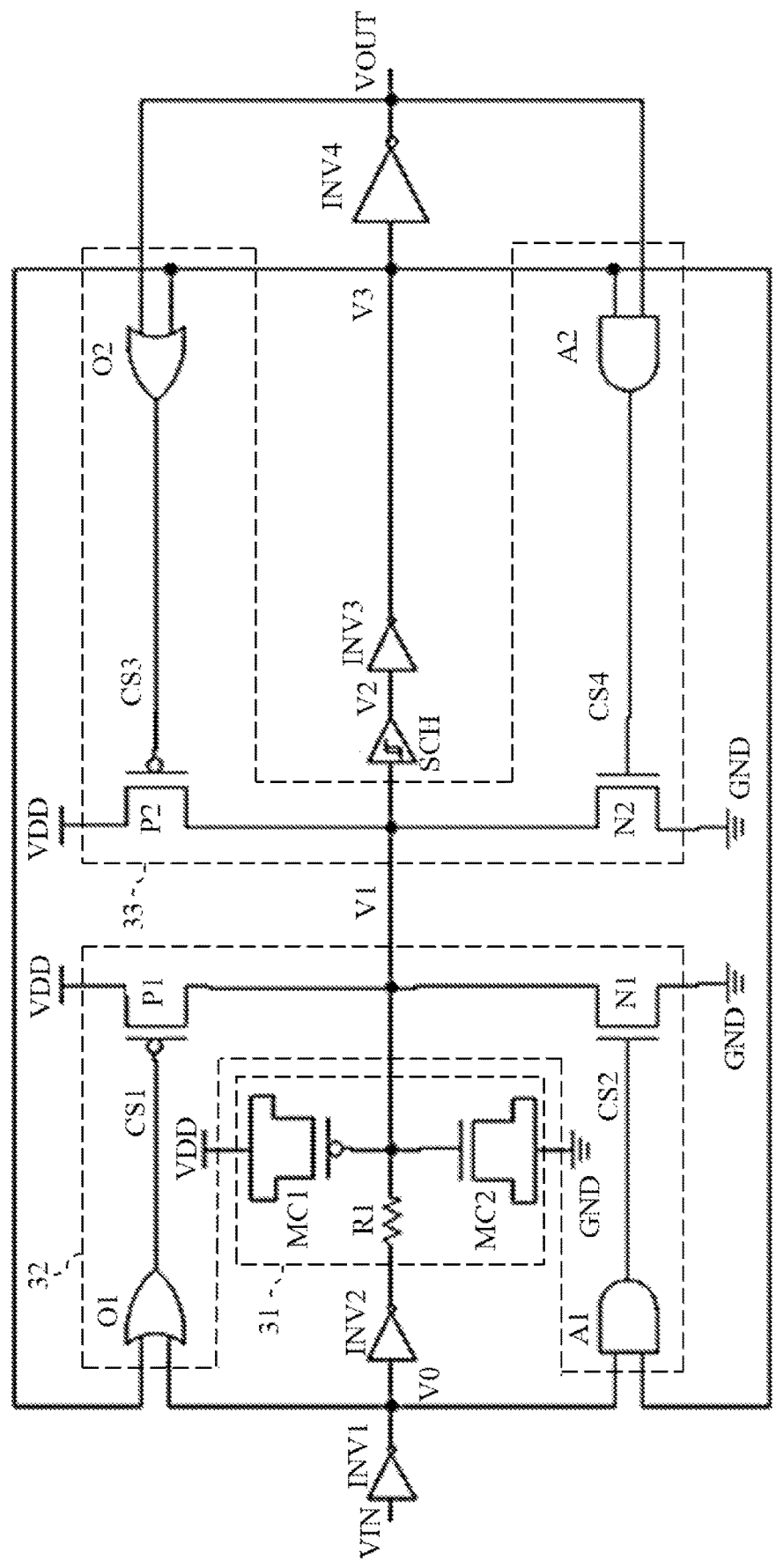
FIG. 3 is a circuit diagram of a low-pass filter circuit according to an embodiment of the present disclosure.

Refer to FIG. 3, which is a circuit diagram of a low-pass filter circuit according to an embodiment of the present disclosure. In this embodiment, a glitch-free low-pass filter circuit 3 comprises an integrating circuit 31, a Schmitt trigger SCH and two feedback logic circuits 32 and 33. The integrating circuit 31 is electrically connected to the two feedback logic circuits 32, 33 and the Schmitt trigger SCH. Preferably, in this embodiment, the low-pass filter circuit 3 further comprises inverters INV1-INV4, but the number and arrangement of the inverters INV1-INV4 are just examples and not intended to limit the scope of the present disclosure.

An input end of the inverter INV1 is configured to receive an input signal VIN, and the inverter INV1 performs an inversion process on the input signal VIN to generate an inverted input signal V0. An input end of the inverter INV2 is electrically connected to an output end of the inverter INV1 to receive the inverted input signal V0. As well, the inverter INV2 is configured to perform the inversion process on the inverted input signal V0 to generate the input signal VIN with the twice inversion process. An output end of the inverter INV2 is configured to output the input signal VIN with the twice inversion process to the integrating circuit 31.

The integrating circuit 31 is configured to receive the input signal VIN of the low-pass filter circuit 3, that is, the input signal VIN with twice inversion process output from the output end of the inverter INV2. Also, the integrating circuit 31 integrates the input signal VIN to generate an integral signal V1. The integrating circuit 31 is usually a resistor-capacitor charge storage circuit, and one of the embodiments of the resistor-capacitor charge storage circuit will be described later. The Schmitt trigger SCH is electrically connected to the integrating circuit 31, and configured to receive the integral signal V1 and generate a hysteresis signal V2 based on the integral signal V1.

An input end of the inverter INV3 is configured to receive the hysteresis signal V2, and generate an inverted hysteresis signal V3 by performing the inversion process on the hysteresis signal V2. An input end of the inverter INV4 is electrically connected to an output end of the inverter INV3 to receive the inverted hysteresis signal V3. Also, the inverter INV4 is configured to perform the inversion process on the inverted hysteresis signal V3 to generate the hysteresis signal V2 as an output signal VOUT. An output end of the inverter INV4 is configured to output the hysteresis signal V2, on which the inversion process is performed twice, as the output signal VOUT of the low-pass filter circuit 3.

The feedback logic circuit 32 is configured to pull the integral signal V1 down to the reset voltage or up to the set voltage based on the inverted input signal V0 and the inverted hysteresis signal V3. Moreover, the inverted input signal V0 is generated by performing the inversion process on the input signal VIN, and the inverted hysteresis signal V3 is generated by performing the inversion process on the hysteresis signal V2. As well, in this embodiment, the reset voltage is a ground voltage GND, and the set voltage is a system voltage VDD.

Further, when the input signal VIN and the hysteresis signal V2 are a logic high level, the feedback logic circuit 32 pulls the integral signal V1 up to the set voltage. Also, when the input signal VIN and the hysteresis signal V2 are a logic low level, the feedback logic circuit 32 pulls the integral signal V1 down to the reset voltage. Simply, the feedback logic circuit 32 is configured to pull the integral signal V1 down to the reset voltage or up to the set voltage based on the input signal VIN and the hysteresis signal V2. Consequently, the feedback logic circuit 32 is configured to control the charging and discharging operations for capacitors MC1 and MC2 of the integrating circuit 31 during normal operation.

The feedback logic circuit 33 is electrically connected to the Schmitt trigger SCH and the integrating circuit 31. The feedback logic circuit 33 is configured to pull the integral signal V1 down to the reset voltage or up to the set voltage based on the inverted hysteresis signal V3 and the output signal VOUT of the low-pass filter circuit 3. When the inverted hysteresis signal V3 and the output signal VOUT are the logic low level, the feedback logic circuit 33 pulls the integral signal V1 up to the set voltage. Also, when the inverted hysteresis signal V3 and the output signal VOUT are the logic high level, the feedback logic circuit 33 pulls the integral signal V1 down to the reset voltage. There is a delay time difference between the inverted hysteresis signal V3 and the output signal VOUT, and the output signal VOUT is the hysteresis signal V2 with twice inversion process. Therefore, it can be considered that the feedback logic circuit 33 pulls the integral signal V1 down to the reset voltage or up to the set voltage based on a transition state of the hysteresis signal V2. Because of the aforementioned mechanism, regardless of the state of the input signal VIN, when the hysteresis signal V2 is transitioned, the feedback logic circuit 33 pulls the integral signal V1 down to the reset voltage or up to the set voltage. In other words, in the arbitration of whether to charge or discharge the capacitors MC1 and MC2, the priority of the transition state of the hysteresis signal V2 is greater than the priority of a signal value of the input signal VIN.

In an embodiment of the present disclosure, one of the implemented manners of the integrating circuit 31 is described as follow. The integrating circuit 31 comprises the capacitors MC1, MC2 and a resistor R1. The capacitor MC1 is implemented with a P-type MOS transistor, the capacitor MC2 is implemented with an N-type MOS transistor, but the present disclosure is not limited thereto. One end of the capacitor MC1 is electrically connected to the set voltage. For example, the set voltage can be the system voltage VDD or other type high voltage. One end of the capacitor MC2 is electrically connected to the other end of the capacitor MC1, and the other end of the capacitor MC2 is electrically connected to the reset voltage, such as the ground voltage GND or be other type low voltage. One end of the resistor R1 is electrically connected to the other end of the capacitor MC1, the end of the capacitor MC2 and an input end of the Schmitt trigger. Also, the end of the resistor R1 is configured as an output end of the integrating circuit 31 to output the integral signal V1. The other end of the resistor R1 is configured as a receiving end of the integrating circuit 31 to receive the input signal VIN.

In an embodiment of the present disclosure, one of implementation manners of the feedback logic circuit 32 is as follow, but the present disclosure is not limited thereto. The feedback logic circuit 32 comprises logic gates O1, A1, and switches P1 and N1. The logic gate O1 is electrically connected to the Schmitt trigger SCH. The logic gate O1 is configured to generate a control signal CS1 based on the inverted input signal V0 and the inverted hysteresis signal V3. The switch P1 is electrically connected to the set voltage, the integrating circuit 31 and the logic gate O1. The switch P1 is configured to pull the integral signal V1 up to the set voltage based on the control signal CS1. The logic gate A1 is electrically connected to the Schmitt trigger SCH. The logic gate A1 is configured to generate a control signal CS2 based on the inverted input signal V0 and the inverted hysteresis signal V3. The switch N1 is electrically connected to the reset voltage, the integrating circuit 31 and the logic gate A1. The switch N1 is configured to pull the integral signal V1 down to the reset voltage based on the control signal CS2. The logic gate O1 is an OR gate, and the logic gate A1 is an AND gate. The switch P1 is a P-type MOS transistor, and the switch N1 is an N-type MOS transistor.

In an embodiment of the present disclosure, one of implementation manners of the feedback logic circuit 33 is as follow, but the present disclosure is not limited thereto. The feedback logic circuit 33 comprises logic gates O2, A2, and switches P2 and N2. The logic gate O2 is electrically connected to the Schmitt trigger SCH. The logic gate O2 is configured to generate a control signal CS3 based on the inverted hysteresis signal V3 and the output signal VOUT. The switch P2 is electrically connected to the set voltage, the integrating circuit 31 and the logic gate O2. The switch P2 is configured to pull the integral signal V1 up to the set voltage based on the control signal CS3. The logic gate A2 is electrically connected to the Schmitt trigger SCH. The logic gate A2 is configured to generate a control signal CS4 based on the inverted hysteresis signal V3 and the output signal VOUT. The switch N2 is electrically connected to the reset voltage, the integrating circuit 31 and the logic gate A2. The switch N2 is configured to pull the integral signal V1 down to the reset voltage based on the control signal CS4. The logic gate O2 is an OR gate, and the logic gate A2 is an AND gate. The switch P2 is a P-type MOS transistor, and the switch N2 is an N-type MOS transistor.

Figure 4:
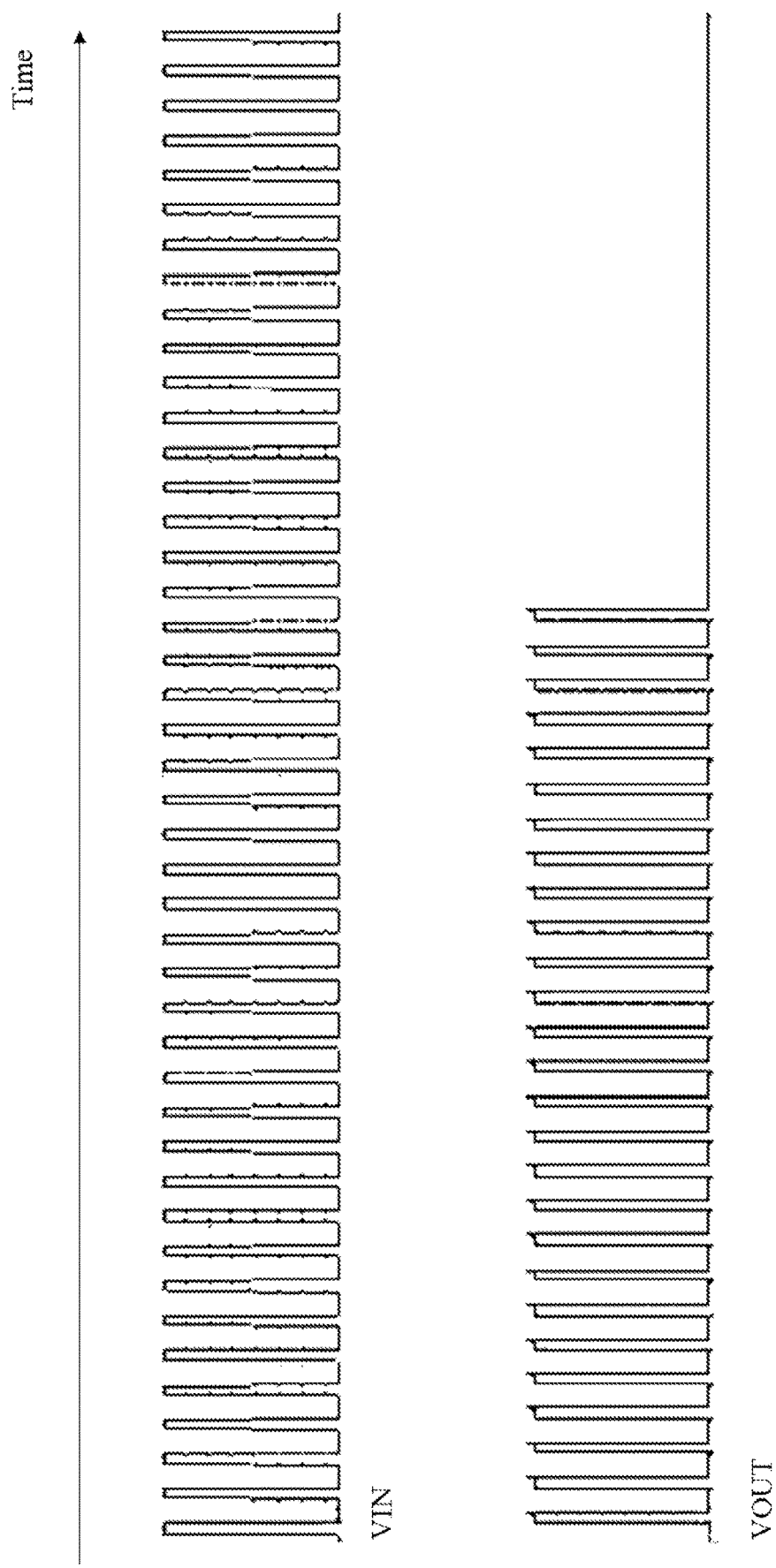
FIG. 4 is a waveform diagram of a signal in a low-pass filter circuit according to an embodiment of the present disclosure.

Please refer to FIG. 3 and FIG. 4. FIG. 4 is a waveform diagram of a signal of a low-pass filter circuit according to an embodiment of the present disclosure. As shown in FIG. 4, a pulse width of the input signal VIN decreases with time. With the operation of the low-pass filter circuit 3, when the pulse width of the input signal VIN is smaller than a preset pulse width, the output signal VOUT is the logic low level; that is, the input signal VIN is filtered out completely via the low-pass filter circuit 3. Furthermore, compared with the related art, the embodiment of the present disclosure is able to solve the problem of the edge of the output signal VOUT in the related art having the short pulse caused by the capacitor being not charged or discharged correctly. Also, the edge of the output signal VOUT in FIG. 4 does not have any short pulse.

As stated above, the glitch-free low-pass filter circuit provided by the embodiments of the present disclosure can achieve the following technical effects. First, even if the pulse width of the input signal is close to the preset filter pulse width corresponding to the low-pass filter circuit, the output signal does not have the short pulse. Second, the glitch-free low-pass filter circuit provided by the embodiments of the present disclosure can be used as the front-end circuit of the load circuit in the system circuit, which can more effectively solve the power or clock glitch attack from hackers. As well, the glitch-free low-pass filter circuit provided by the embodiments of the present disclosure can also provide an output power supply or an output clock to the load circuit, so that the load circuit can operate correctly. Third, the arbitration mechanism can prevent the capacitor of the integrating circuit from being not fully charged or discharged. As a result, the technical problem of the transition of the output signal caused by the pulse width of the input signal smaller than the expected pulse width is solved.

It should be understood that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. A glitch-free low-pass filter circuit, comprising:
   an integrating circuit, configured to receive an input signal of the low-pass filter circuit, and integrate the input signal to generate an integral signal;
   a Schmitt trigger, electrically connected to the integrating circuit, and configured to receive the integral signal and generate a hysteresis signal based on the integral signal;
   a first feedback logic circuit, electrically connected to the integrating circuit and the Schmitt trigger, and configured to pull the integral signal down to a reset voltage or up to a set voltage based on an inverted input signal and an inverted hysteresis signal, wherein the inverted input signal is generated by performing an inversion process on the input signal, and the inverted hysteresis signal is generated by performing the inversion process on the hysteresis signal; and
   a second feedback logic circuit, electrically connected to the Schmitt trigger and the integrating circuit, and configured to pull the integral signal down to the reset voltage or up to the set voltage based on the inverted hysteresis signal and an output signal of the low-pass filter circuit, wherein the output signal is generated by performing the inversion process on the hysteresis signal twice.

2. The glitch-free low-pass filter circuit according to claim 1, wherein the integrating circuit comprising:
   a first capacitor, wherein one end of the first capacitor is electrically connected to the set voltage;
   a second capacitor, wherein one end of the second capacitor is electrically connected to the other end of the first capacitor, and the other end of the second capacitor is electrically connected to the reset voltage; and
   a resistor, wherein one end of the resistor is electrically connected to the other end of the first capacitor, the end of the second capacitor and an input end of the Schmitt trigger, the end of the resistor is configured as an output end of the integrating circuit to output the integral signal, and the other end of the resistor is configured as a receiving end of the integrating circuit to receive the input signal.

3. The glitch-free low-pass filter circuit according to claim 1, further comprising:
   a first input inverter and a second input inverter, wherein an input end of the first input inverter is configured to receive the input signal, an input end of the second input inverter is electrically connected to an output end of the first input inverter to receive the inverted input signal, and an output end of the second input inverter is configured to output the input signal, on which the inversion process is performed twice, to the integrating circuit.

4. The glitch-free low-pass filter circuit according to claim 1, wherein the first feedback logic circuit comprises:
   a first logic gate, electrically connected to the Schmitt trigger, and configured to generate a first control signal based on the inverted input signal and the inverted hysteresis signal;
   a first switch, electrically connected to the set voltage, the integrating circuit and the first logic gate, and configured to pull the integral signal up to the set voltage based on the first control signal;
   a second logic gate, electrically connected to the Schmitt trigger, and configured to generate a second control signal based on the inverted input signal and the inverted hysteresis signal; and
   a second switch, electrically connected to the reset voltage, the integrating circuit and the second logic gate, and configured to pull the integral signal down to the reset voltage based on the second control signal.

5. The glitch-free low-pass filter circuit according to claim 4, wherein the first logic gate is an OR gate, the second logic gate is an AND gate, the first switch is a P-type MOS transistor, and the second switch is an N-type MOS transistor.

6. The glitch-free low-pass filter circuit according to claim 1, further comprising:
   a first output inverter and a second output inverter, wherein an input end of the first output inverter is configured to receive the hysteresis signal, an input end of the second output inverter is electrically connected to an output end of the first output inverter to receive the hysteresis signal, and an output end of the second output inverter is configured to output the hysteresis signal, on which the inversion process is performed twice, as the output signal of the low-pass filter circuit.

7. The glitch-free low-pass filter circuit according to claim 1, wherein the second feedback logic circuit comprises:
   a third logic gate, electrically connected to the Schmitt trigger, and configured to generate a third control signal based on the inverted hysteresis signal and the output signal;
   a third switch, electrically connected to the set voltage, the integrating circuit and the third logic gate, and configured to pull the integral signal up to the set voltage based on the third control signal;
   a fourth logic gate, electrically connected to the Schmitt trigger, and configured to generate a fourth control signal based on the inverted hysteresis signal and the output signal; and
   a fourth switch, electrically connected to the reset voltage, the integrating circuit and the fourth logic gate, and configured to pull the integral signal down to the reset voltage based on the fourth control signal.

8. The glitch-free low-pass filter circuit according to claim 7, wherein the third logic gate is an OR gate, the fourth logic gate is an AND gate, the third switch is a P-type MOS transistor, and the fourth switch is an N-type MOS transistor.

9. A glitch-free low-pass filter circuit, comprising:
   an integrating circuit, configured to receive an input signal of the low-pass filter circuit, and integrate the input signal to generate an integral signal;
   a Schmitt trigger, electrically connected to the integrating circuit, and configured to receive the integral signal, and generate a hysteresis signal based on the integral signal;
   a first feedback logic circuit, electrically connected to the integrating circuit and the Schmitt trigger, and configured to pull the integral signal down to a reset voltage or up to a set voltage based on the input signal and the hysteresis signal; and
   a second feedback logic circuit, electrically connected to the Schmitt trigger and the integrating circuit, and configured to pull the integral signal down to the reset voltage or up to the set voltage based on a transition state of the hysteresis signal;
   wherein when the hysteresis signal is transitioned, the second feedback logic circuit pulls the integral signal down to the reset voltage or up to the set voltage regardless of a state of the input signal.

10. A system circuit, comprising:
    a glitch-free low-pass filter circuit, comprising:
       an integrating circuit, configured to receive an input signal of the low-pass filter circuit, and integrate the input signal to generate an integral signal;
       a Schmitt trigger, electrically connected to the integrating circuit, and configured to receive the integral signal, and generate a hysteresis signal based on the integral signal;
       a first feedback logic circuit, electrically connected to the integrating circuit and the Schmitt trigger, and configured to pull the integral signal down to a reset voltage or up to a set voltage based on an inverted input signal and an inverted hysteresis signal, wherein the inverted input signal is generated by performing an inversion process on the input signal, and the inverted hysteresis signal is generated by performing the inversion process on the hysteresis signal; and
       a second feedback logic circuit, electrically connected to the Schmitt trigger and the integrating circuit, and configured to pull the integral signal down to the reset voltage or up to the set voltage based on the inverted hysteresis signal and an output signal of the low-pass filter circuit, wherein the output signal is generated by performing the inversion process on the hysteresis signal twice; and
    a load circuit, electrically connected to the low-pass filter circuit, and configured to receive the output signal as a clock signal for operation.

11. The system circuit according to claim 10, wherein the integrating circuit comprising:
    a first capacitor, wherein one end of the first capacitor is electrically connected to the set voltage;
    a second capacitor, wherein one end of the second capacitor is electrically connected to the other end of the first capacitor, and the other end of the second capacitor is electrically connected to the reset voltage; and
    a resistor, wherein one end of the resistor is electrically connected to the other end of the first capacitor, the end of the second capacitor and an input end of the Schmitt trigger, the end of the resistor is configured as an output end of the integrating circuit to output the integral signal, and the other end of the resistor is configured as a receiving end of the integrating circuit to receive the input signal.

12. The system circuit according to claim 10, wherein the low-pass filter circuit further comprises:
    a first input inverter and a second input inverter, wherein an input end of the first input inverter is configured to receive the input signal, an input end of the second input inverter is electrically connected to an output end of the first input inverter to receive the inverted input signal, and an output end of the second input inverter is configured to output the input signal performed the inversion process twice to the integrating circuit.

13. The system circuit according to claim 10, wherein the first feedback logic circuit comprises:
    a first logic gate, electrically connected to the Schmitt trigger, and configured to generate a first control signal based on the inverted input signal and the inverted hysteresis signal;
    a first switch, electrically connected to the set voltage, the integrating circuit and the first logic gate, and configured to pull the integral signal up to the set voltage based on the first control signal;
    a second logic gate, electrically connected to the Schmitt trigger, and configured to generate a second control signal based on the inverted input signal and the inverted hysteresis signal; and
    a second switch, electrically connected to the reset voltage, the integrating circuit and the second logic gate, and configured to pull the integral signal down to the reset voltage based on the second control signal.

14. The system circuit according to claim 13, wherein the first logic gate is an OR gate, the second logic gate is an AND gate, the first switch is a P-type MOS transistor, and the second switch is an N-type MOS transistor.

15. The system circuit according to claim 10, wherein the low-pass filter circuit further comprises:
    a first output inverter and a second output inverter, wherein an input end of the first output inverter is configured to receive the hysteresis signal, an input end of the second output inverter is electrically connected to an output end of the first output inverter to receive the hysteresis signal, and an output end of the second output inverter is configured to output the hysteresis signal performed the inversion process twice as the output signal of the low-pass filter circuit.

16. The system circuit according to claim 10, wherein the second feedback logic circuit comprises:
   a third logic gate, electrically connected to the Schmitt trigger, and configured to generate a third control signal based on the inverted hysteresis signal and the output signal;
   a third switch, electrically connected to the set voltage, the integrating circuit and the third logic gate, and configured to pull the integral signal up to the set voltage based on the third control signal;
   a fourth logic gate, electrically connected to the Schmitt trigger, and configured to generate a fourth control signal based on the inverted hysteresis signal and the output signal; and
   a fourth switch, electrically connected to the reset voltage, the integrating circuit and the fourth logic gate, and configured to pull the integral signal down to the reset voltage based on the fourth control signal.

17. The system circuit according to claim 16, wherein the third logic gate is an OR gate, the fourth logic gate is an AND gate, the third switch is a P-type MOS transistor, and the fourth switch is an N-type MOS transistor.

* * * * *